(12) United States Patent
Kong et al.

(10) Patent No.: US 12,236,706 B2
(45) Date of Patent: Feb. 25, 2025

(54) FINGERPRINT SENSOR AND ELECTRONIC DEVICE

(71) Applicants: Beijing BOE Optoelectronics Technology Co., Ltd., Beijing (CN); BOE Technology Group Co., Ltd., Beijing (CN)

(72) Inventors: Dexi Kong, Beijing (CN); Cheng Li, Beijing (CN); Lin Zhou, Beijing (CN); Zixiao Chen, Beijing (CN); Gen Huang, Beijing (CN); Shoujin Cai, Beijing (CN); Jie Zhang, Beijing (CN); Jin Cheng, Beijing (CN); Yingzi Wang, Beijing (CN); Caixia Zhang, Beijing (CN); Qian Tan, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/027,072

(22) PCT Filed: Mar. 16, 2022

(86) PCT No.: PCT/CN2022/081281
§ 371 (c)(1),
(2) Date: Mar. 17, 2023

(87) PCT Pub. No.: WO2023/173342
PCT Pub. Date: Sep. 21, 2023

(65) Prior Publication Data
US 2024/0312240 A1    Sep. 19, 2024

(51) Int. Cl.
*G06F 3/044* (2006.01)
*G06V 40/13* (2022.01)

(52) U.S. Cl.
CPC .............. *G06V 40/1318* (2022.01)

(58) Field of Classification Search
CPC .............. G06F 3/0447; G06F 3/0448
See application file for complete search history.

(56) References Cited

U.S. PATENT DOCUMENTS 6,688,186 B2    2/2004  Chae
2018/0025200 A1  1/2018  Frye et al.
(Continued)

FOREIGN PATENT DOCUMENTS

CN    101656299 A    2/2010
CN    108878467 A    11/2018
(Continued)

*Primary Examiner* — Dennis P Joseph
(74) *Attorney, Agent, or Firm* — IPro, PLLC

(57) ABSTRACT

Provided is a fingerprint sensor, including: a substrate; a plurality of photosensitive devices disposed on the substrate; a light-emitting module disposed on a side, distal to the substrate, of the plurality of photosensitive devices; and a protective cover disposed on a side, distal to the substrate, of the light-emitting module, wherein the protective cover is provided with a plurality of conductive structures electrically connected to the light-emitting module, the plurality of conductive structures being in one-to-one correspondence with the plurality of photosensitive devices, and an orthographic projection of each conductive structure onto the substrate at least partially being overlapped with an orthographic projection of the photosensitive device corresponding to the conductive structure onto the substrate.

16 Claims, 6 Drawing Sheets

(56) References Cited

U.S. PATENT DOCUMENTS

2021/0366966 A1 11/2021 Li et al.
2023/0267759 A1* 8/2023 Ku .................... G06V 40/1365
    345/156

FOREIGN PATENT DOCUMENTS

| CN | 109791961 A | 5/2019 |
| CN | 111564506 A | 8/2020 |
| WO | 2017065346 A1 | 4/2017 |
| WO | 2017074097 A1 | 5/2017 |

* cited by examiner

FINGERPRINT SENSOR AND ELECTRONIC DEVICE

This application is a U.S. national stage of international application No. PCT/CN2022/081281, filed on Mar. 16, 2022, entitled "FINGERPRINT SENSOR AND ELECTRONIC DEVICE", the disclosure of which is herein incorporated by reference in its entirety.

TECHNICAL FIELD

The present disclosure relates to the field of sensor technologies, in particular, relates to a fingerprint sensor and an electronic device.

BACKGROUND OF THE INVENTION

With the development of science and technology, fingerprint sensors have been gradually applied to people's daily life. The fingerprint of the human body can be checked by the fingerprint sensor. The fingerprint of the human body is an innate biological feature, which is a pattern composed of a series of fingerprint ridges and fingerprint valleys on the surface of the fingertip skin.

SUMMARY OF THE INVENTION

Embodiments of the present disclosure provide a fingerprint sensor and an electronic device. The technical solution is as follows:

According to some embodiments provided by the present disclosure, a fingerprint sensor is provided. The fingerprint sensor includes:

a substrate;

a plurality of photosensitive devices disposed on the substrate;

a light-emitting module disposed on a side, distal to the substrate, of the plurality of photosensitive devices; and a protective cover disposed on a side, distal to the substrate, of the light-emitting module, wherein the protective cover is provided with a plurality of conductive structures electrically connected to the light-emitting module, the plurality of conductive structures being in one-to-one correspondence with the plurality of photosensitive devices, and an orthographic projection of each conductive structure onto the substrate at least partially being overlapped with an orthographic projection of the photosensitive device corresponding to the conductive structure onto the substrate.

In some embodiments, the orthographic projection of each conductive structure onto the substrate falls within the orthographic projection of the photosensitive device corresponding to the conductive structure onto the substrate.

In some embodiments, an area of the orthographic projection of each conductive structure onto the substrate is less than or equal to an area of the orthographic projection of the photosensitive device corresponding to the conductive structure onto the substrate.

In some embodiments, a width of the orthographic projection of each conductive structure onto the substrate in a target direction is equal to a width of the orthographic projection of the photosensitive device corresponding to the conductive structure onto the substrate in the target direction; or the width of the orthographic projection of each conductive structure onto the substrate in the target direction is equal to half of the width of the photosensitive device corresponding to the conductive structure onto the substrate in the target direction;

wherein the target direction is a row arrangement direction or a column arrangement direction of the plurality of photosensitive devices.

In some embodiments, the protective cover includes an insulating protective layer and the plurality of conductive structures, the insulating protective layer being provided with a plurality of through holes in one-to-one correspondence with the plurality of conductive structures, and each conductive structure being disposed in the through hole corresponding to the conductive structure.

In some embodiments, each conductive structure is a columnar structure distributed in the through hole corresponding to the conductive structure, and a thickness of the insulating protective layer is the same as a height of the conductive structure.

In some embodiments, an orthographic projection of the through hole onto the substrate is circular, and a distance between any two adjacent through holes in the insulating protective layer is greater than or equal to a diameter of the through hole.

In some embodiments, the insulating protective layer is a sheet-like structure made of at least one of glass material, ceramic material and polycarbonate.

In some embodiments, the conductive structure is a columnar structure made of at least one of copper, silver, aluminum and iron.

In some embodiments, the thickness of the insulating protective layer ranges from 0.1 mm to 0.5 mm.

In some embodiments, the fingerprint sensor further includes an adhesive layer disposed between the protective cover and the light-emitting module, an orthographic projection of the adhesive layer onto the substrate being not in coincidence with orthographic projections of the conductive structures onto the substrate.

In some embodiments, the light-emitting module includes a first light-transmitting electrode, a light-emitting layer and a dielectric layer laminated in a direction perpendicular to and away from the substrate, the dielectric layer being electrically connected to the conductive structure;

the photosensitive device includes a first light-shielding electrode, a photoelectric conversion layer and a second light-transmitting electrode laminated in the direction perpendicular to and away from the substrate; and the fingerprint sensor further includes a light-transmitting shielding electrode disposed between the first light-transmitting electrode and the second light-transmitting electrode, the light-transmitting shielding electrode being insulated from the first light-transmitting electrode and the second light-transmitting electrode.

In some embodiments, the dielectric layer is a light-shielding dielectric layer.

In some embodiments, the dielectric layer includes a protective dielectric layer and a light-shielding dielectric layer that are laminated, the protective dielectric layer being closer to the protective cover than the light-shielding dielectric layer being.

In some embodiments, the fingerprint sensor further includes a drive circuit disposed on the substrate and electrically connected to the first light-shielding electrode in the photosensitive device.

In some embodiments, the drive circuit is provided with at least one thin-film transistor, and the photosensitive device further includes a second light-shielding electrode disposed on a side, distal to the substrate, of the second light-transmitting electrode, an orthographic projection of the second light-shielding electrode onto the substrate being not in coincidence with an orthographic projection of the photoelectric conversion layer onto the substrate, and an orthographic projection of an active layer in the thin-film transistor onto the substrate falling within the orthographic projection of the second light-shielding electrode onto the substrate.

According to some embodiments provided by the present disclosure, an electronic device is provided. The electronic device includes a control component, and any one of the above fingerprint sensors electrically connected to the control component.

In some embodiments, the electronic device further includes: an encapsulation housing connected to an edge area of the fingerprint sensor, and a metal sheet disposed on the encapsulation housing, and wherein the control component is provided with an AC drive unit, a power line of the AC drive unit being electrically connected to a first light-transmitting electrode in the light-emitting module, and a ground line of the AC drive unit being electrically connected to the metal sheet.

BRIEF DESCRIPTION OF DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and persons of ordinary skill in the art still derives other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

Figure 1:
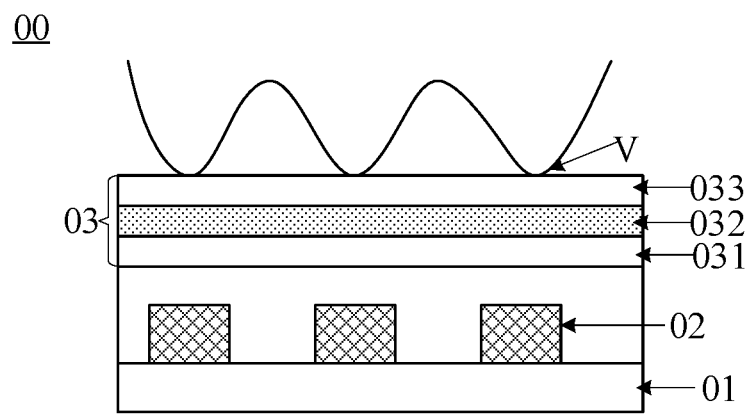
FIG. 1 is a schematic structural diagram of a fingerprint sensor in the related art.

In the related art, referring to FIG. 1, FIG. 1 is a schematic structural diagram of a fingerprint sensor in the related art. The fingerprint sensor 00 includes a substrate 01, a plurality of photosensitive devices 02 disposed on the substrate 01 and a light-emitting module 03 disposed on a side, distal to the substrate 01, of the plurality of photosensitive devices 02. In this way, after the light-emitting module 03 emits light, at least some of the plurality of photosensitive devices 02 sense the light emitted by the light-emitting module 03.

Figure 2:
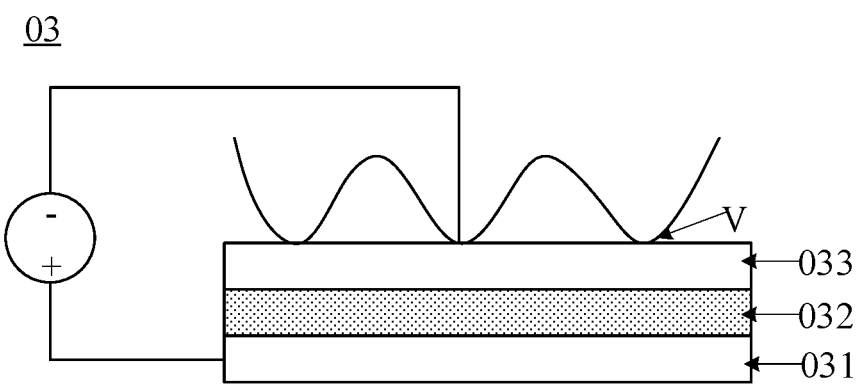
FIG. 2 is a light emission diagram of a light-emitting module in the related art.

Referring to FIG. 2, FIG. 2 is a light emission diagram of a light-emitting module in the related art. The light-emitting module 03 includes a first electrode layer 031, a light-emitting layer 032 and a dielectric layer 033 that are laminated. The first electrode layer 031 is closer to the photosensitive device 02 than the light-emitting layer 032 is. Here, it is usually necessary to apply a certain amount of AC power to the first electrode layer 031 in the light-emitting module 03 by an AC drive module, and a human body needs to be in contact with a ground terminal of the AC drive module. In this way, when a finger of the human body contacts the dielectric layer 033 in the light-emitting module 03, an electric field will be formed between a fingerprint ridge V in the finger and the first electrode layer 031, such that the light-emitting layer 033 emits light under the action of the electric field force.

In this case, after a user's finger presses the fingerprint sensor, a fingerprint ridge V in the user's finger is in contact with the dielectric layer 033 in the light-emitting module 03, such that an electric field can be formed between the fingerprint ridge V in contact with the dielectric layer 033 and the first electrode layer 031, and under the action of the electric field force, a part of the light-emitting layer 032 corresponding to the fingerprint ridge V emits light. Afterwards, the light emitted by the part of the light-emitting layer 032 corresponding to the fingerprint ridge V is sensed by the corresponding photosensitive device 02, and the photosensitive device 02 that senses the light can convert the light signal into an electrical signal and transmit the same to a control component electrically connected to the fingerprint sensor 00 in the form of the electrical signal, such that the control component can generate a fingerprint image of the user based on the received electrical signal.

However, since the hardness of the dielectric layer 033 in the light-emitting module 03 is generally low and the dielectric layer 033 is in direct contact with the user's finger, a side, distal to the substrate 01, of the dielectric layer 033 in the fingerprint sensor 00 is easily scratched, which leads to poor sensing effect of the fingerprint sensor 00.

Moreover, in the related art, if a protective layer is provided on the side, distal to the substrate 01, of the dielectric layer 033 in the light-emitting module 03, the dielectric layer 033 in the light-emitting module 03 can be protected, such that the probability of the side, distal to the substrate 01, of the light-emitting module 03 being scratched is reduced. However, after the user's finger presses the fingerprint sensor 00, the fingerprint ridge V in the user's finger is separated from the dielectric layer 033 by the protective layer provided on the side, distal to the substrate 01, of the light-emitting module 03, and therefore the fingerprint sensor 00 cannot work properly. To this end, the present disclosure proposes the following content.

Figure 3:
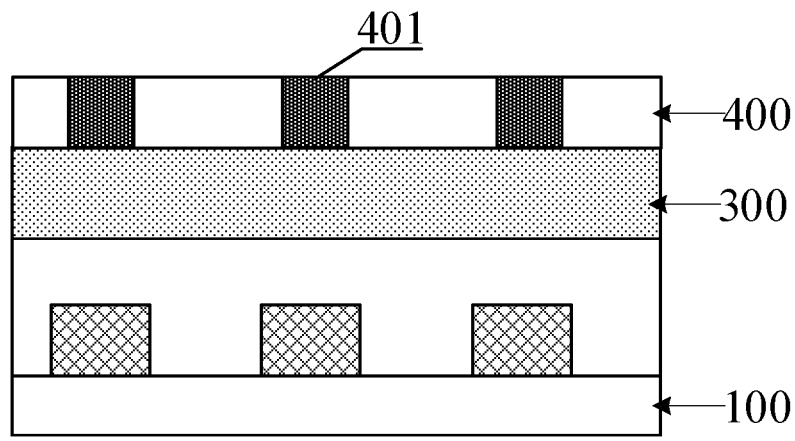
FIG. 3 is a schematic structural diagram of a fingerprint sensor according to some embodiments of the present disclosure.

In some embodiments of the present disclosure, referring to FIG. 3, FIG. 3 is a schematic structural diagram of a fingerprint sensor according to some embodiments of the present disclosure. The fingerprint sensor 000 includes a substrate 100, a plurality of photosensitive devices 200 disposed on the substrate 100, a light-emitting module 300 disposed on a side, distal to the substrate 100, of the plurality of photosensitive devices 200 and a protective cover 400 disposed on a side, distal to the substrate 100, of the light-emitting module 300. Here, the plurality of photosensitive devices 200 are arranged in an array on the substrate 100, and the light-emitting module 300 is disposed on the side, distal to the substrate 100, of the plurality of photosensitive devices 200 in an entire layer.

The protective cover 400 is provided with a plurality of conductive structures 401 electrically connected to the light-emitting module 300. The plurality of conductive structures 401 are in one-to-one correspondence with the plurality of photosensitive devices 200. An orthographic projection of each conductive structures 401 onto the substrate 100 is at least partially overlapped with an orthographic projection of the photosensitive device 200 corresponding to the conductive structures 401 onto the substrate 100.

In this case, when the user's finger presses the fingerprint sensor, the fingerprint ridge in the user's finger is in contact with a part of the conductive structures 401 in the protective cover 400, and then an electrical connection between the fingerprint ridge and the light-emitting module 300 is realized through this part of the conductive structures 401, such that a part of the light-emitting module 300 that is electrically connected with this part of the conductive structures 401 emits light. And since the orthographic projection of each conductive structure 401 onto the substrate 100 is at least partially overlapped with the orthographic projection of the photosensitive device 200 corresponding to the conductive structure 401 onto the substrate 100, the light emitted by the light-emitting module 300 is sensed by the corresponding photosensitive device 200. The photosensitive device 200 that senses the light can convert the light signal into an electrical signal and transmit the same to a control component that is electrically connected to the fingerprint sensor 000 in the form of the electrical signal. The control component can generate a fingerprint image of the user based on the received electrical signal, thereby realizing the detection of the fingerprint of the user's finger. Here, the side where the user's finger is in contact with the fingerprint sensor 000 is the front of the fingerprint sensor 000.

In some embodiments of the present disclosure, since the protective cover 400 is provided with the plurality of conductive structures 401 electrically connected to the light-emitting module 300 and the orthographic projection of each conductive structure 401 onto the substrate 100 is at least partially overlapped with the orthographic projection of the photosensitive device 200 corresponding to the conductive structure 401 onto the substrate 100, under the premise that the light-emitting module 300 can be protected by the protective cover 400, it is ensured that the fingerprint ridge in the user's finger can be electrically connected to the light-emitting module 300 through the conductive structure 401, such that the fingerprint sensor 000 normally detects the fingerprint of the user's finger In summary, the fingerprint sensor according to the embodiments of the present invention includes a substrate, a photosensitive device, a light-emitting module and a protective cover. Since the protective cover is provided with a plurality of conductive structures electrically connected to the light-emitting module and an orthographic projection of each conductive structure onto the substrate is at least partially overlapped with an orthographic projection of the photosensitive device corresponding to the conductive structure onto the substrate, on the premise that the light-emitting module is protected by the protective cover, it is ensured that a fingerprint ridge in a user's finger is electrically connected to the light-emitting module through the conductive structure, such that the fingerprint sensor normally detects the fingerprint of the user's finger. In this way, the probability that a side, distal to the substrate, of the light-emitting module is scratched is effectively reduced, thereby making the sensing effect of the fingerprint sensor better.

Figure 4:
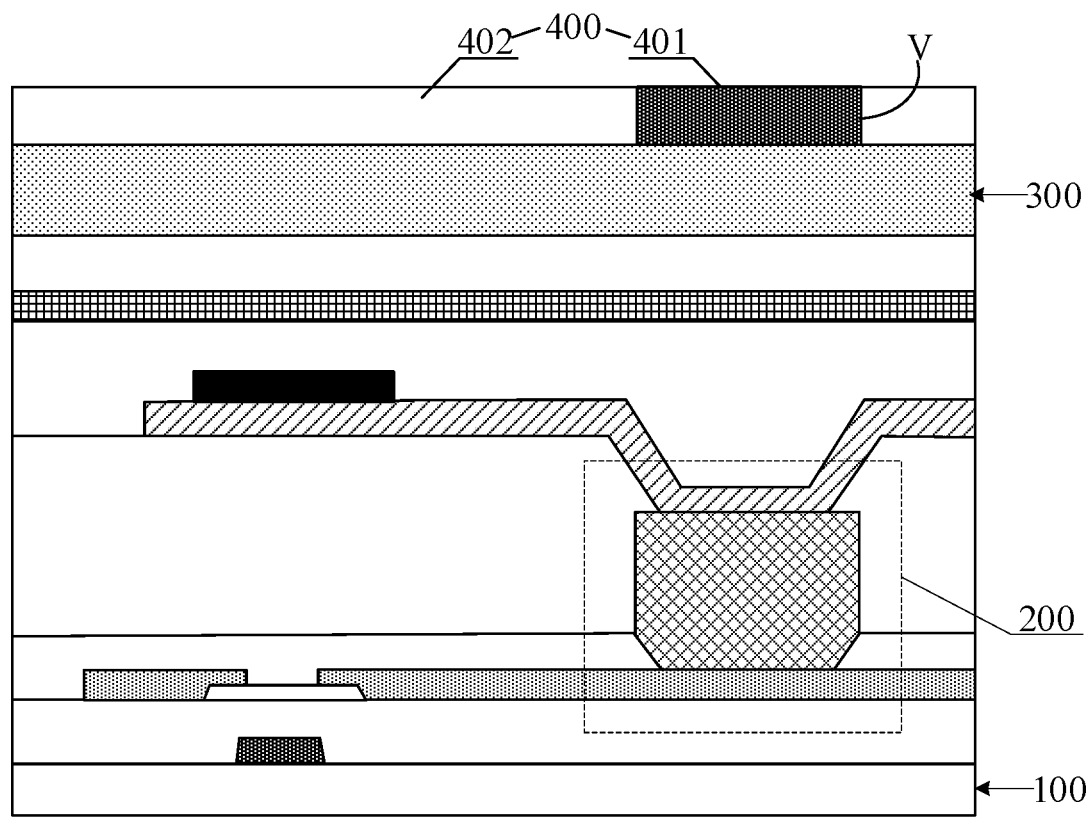
FIG. 4 is a schematic structural diagram of another fingerprint sensor according to some embodiments of the present disclosure.

In some embodiments of the present disclosure, in order to see the schematic structural diagram of the fingerprint sensor more clearly, referring to FIG. 4, FIG. 4 is a schematic structural diagram of another fingerprint sensor according to some embodiments of the present disclosure. The orthographic projection of the conductive structure 401 in the protective cover 400 onto the substrate 100 falls within the corresponding orthographic projection of the photosensitive device 200 onto the substrate 100. In this way, after the conductive structure 401 is in contact with the fingerprint ridge in the user's finger, the part of the light-emitting module 300 that is electrically connected to the conductive structure 401 can emit light, and all the light can be directed to the photosensitive device 200 corresponding to the conductive structure 401, such that the intensity of light sensed by the photosensitive device 200 is high. In this way, the photosensitive device 200 converts the sensed light signal into an electrical signal with a stronger intensity, such that the subsequent fingerprint image generated according to the electrical signal output by the photosensitive device 200 has a better effect.

Figure 5:
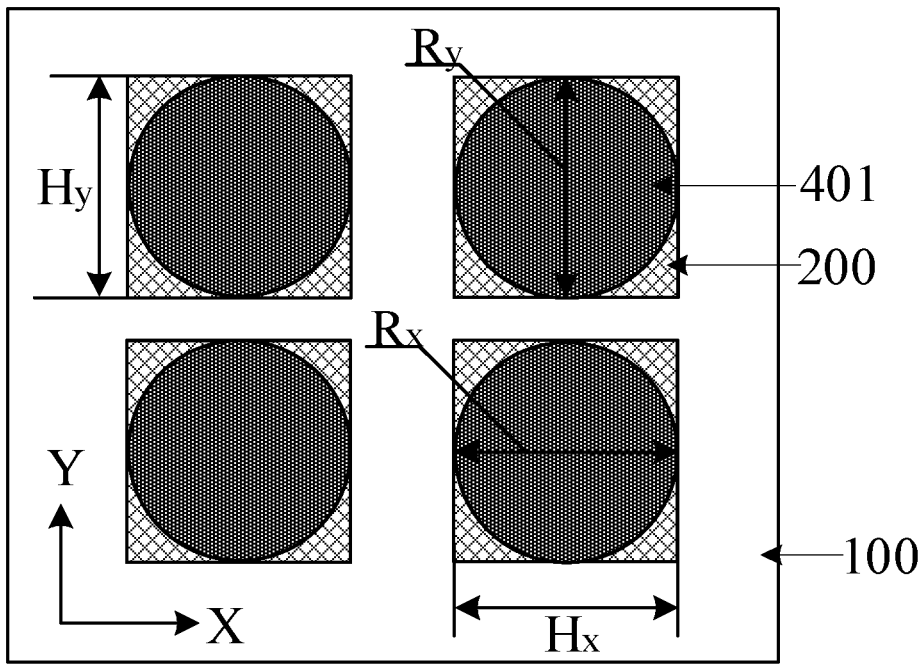
FIG. 5 is a schematic diagram of a positional relationship between a conductive structure and a photosensitive device according to some embodiments of the present disclosure.

In the present disclosure, referring to FIG. 5, FIG. 5 is a schematic diagram of a positional relationship between the conductive structure and the photosensitive device according to some embodiments of the present disclosure. An area of the orthographic projection of the conductive structure 401 in the protective cover 400 onto the substrate 100 is smaller than or equal to an area of the orthographic projection of the corresponding photosensitive device 200 onto the substrate 100. In some embodiments, when the shape of the orthographic projection of the conductive structure 401 onto the substrate 100 is a circle and the shape of the corresponding orthographic projection of the photosensitive device 200 onto the substrate 100 is a square, the circle of the orthographic projection of the conductive structure 401 onto the substrate 100 is an inscribed circle of the square of the corresponding photosensitive device 200 onto the substrate 100. In other possible implementations, the shape of the orthographic projection of the conductive structure 401 onto the substrate 100 is the same as the shape of the corresponding photosensitive device 200 onto the substrate 100, which is not limited in the embodiment of the present disclosure.

In some embodiments of the present disclosure, a width of the orthographic projection of the conductive structure 401 in the protective cover 400 onto the substrate 100 in a target direction is equal to half of a width of the orthographic projection of the corresponding photosensitive device 200 onto the substrate 100 in the target direction. Alternatively, the width of the orthographic projection of the conductive structure 401 in the protective cover 400 onto the substrate 100 in the target direction is equal to the width of the orthographic projection of the corresponding photosensitive device 200 onto the substrate 10 in the target direction. Here, the target direction is a row arrangement direction Y or a column arrangement direction X of the plurality of photosensitive devices 200. It should be noted that, the width of the orthographic projection of the photosensitive device 200 onto the substrate 100 in the target direction ranges from 25 microns to 100 microns.

In this case, when the width of the orthographic projection of the conductive structure 401 onto the substrate 100 in the target direction is equal to half of the width of the corresponding photosensitive device 200 onto the substrate 100 in the target direction, if the width of the orthographic projection of the photosensitive device 200 onto the substrate 100 in the target direction is 50.8 microns, the width of the orthographic projection of the conductive structure 401 onto the substrate 100 in the target direction may be 25.4 microns. When the width of the orthographic projection of the conductive structure 401 onto the substrate 100 in the target direction is equal to the width of the corresponding photosensitive device 200 onto the substrate 100 in the target direction, if the width of the orthographic projection of the photosensitive device 200 onto the substrate 100 in the target direction is 50.8 microns, the width of the orthographic projection of the conductive structure 401 onto the substrate 100 in the target direction is 50.8 microns. In this way, each photosensitive device 200 in the fingerprint sensor 000 has its corresponding conductive structure 401. In this way, after the fingerprint ridge in the user's finger is in contact with the conductive structure 401, the part of the light-emitting module 300 that is electrically connected to the conductive structure 401 can emit light, and the light can be emitted to the photosensitive device 200 corresponding to the conductive structure 401. In this way, each photosensitive device 200 in the fingerprint sensor 000 can sense the light incident on it, such that the sensing accuracy of the fingerprint sensor 000 is higher.

It should be noted that, in FIG. 5, the fact that a width Rx of the orthographic projection of the conductive structure 401 onto the substrate 100 in the column arrangement direction X is equal to a width Hx of the corresponding photosensitive device 200 onto the substrate 100 in the row arrangement direction X and a width Ry of the orthographic projection of the conductive structure 401 onto the substrate 100 in the row arrangement direction Y is equal to a width Hy of the orthographic projection of the corresponding photosensitive device 200 onto the substrate 100 in the row arrangement direction Y is taken as an example for schematic illustration.

In the present disclosure, as shown in FIG. 4, the protective cover 400 includes an insulating protective layer 402 and the plurality of conductive structures 401 mentioned above. The insulating protective layer 402 is provided with a plurality of through holes V in one-to-one correspondence with the plurality of conductive structures 401. The conductive structure 401 is disposed in the corresponding through hole V. Here, the insulating protective layer 402 exists between any two adjacent conductive structures 401, such that no electrical connection is formed between the conductive structures 401. In this way, the fingerprint image sensed by the fingerprint sensor 000 according to some embodiments of the present disclosure is not stuck, thereby effectively improving the quality of the fingerprint image sensed by the fingerprint sensor 000.

In some embodiments of the present disclosure, in the protective cover 400, the conductive structure 401 is a columnar structure distributed in the corresponding through hole V, and a height direction of the conductive structure 401 is parallel to a thickness direction of the insulating protective layer 402. The conductive structure 401 is not higher or lower than the insulating protective layer 402. In the case that the conductive structure 401 is higher than the insulating protective layer 402, the fingerprint ridge in the user's finger is squeezed and deformed by the raised conductive structure 401 when the user's finger contacts the entire surface of the protective cover 400, resulting in that the accuracy of the fingerprint information sensed by the fingerprint sensor 000 is relatively low. In the case that the conductive structure 401 is lower than the insulating protective layer 402, the fingerprint ridge in the user's finger are difficult to contact the conductive structure 401 when the user's finger contacts the entire surface of the protective cover 400, resulting in that the fingerprint sensor 000 cannot sense fingerprint information.

For this reason, the height of the conductive structure 401 in the protective cover 400 is the same as the thickness of the insulating protective layer 402. In this way, the user's finger contacts the entire surface of the protective cover 400 when the user's finger presses the fingerprint sensor 000, the fingerprint ridge in the user's finger is not squeezed and deformed, and the fingerprint ridge in the finger normally contacts the conductive structure 401, which makes the fingerprint information sensed by the fingerprint sensor 000 more accurate.

Figure 6:
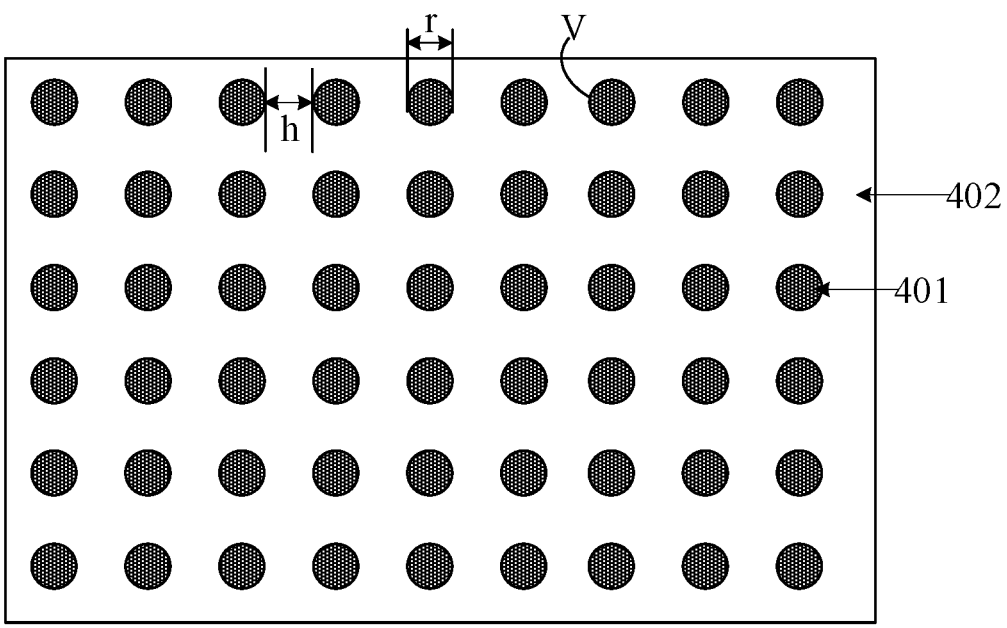
FIG. 6 is a top view of a protective cover according to some embodiments of the present disclosure.

In some embodiments of the present disclosure, referring to FIG. 6, FIG. 6 is a top view of a protective cover according to some embodiments of the present disclosure. FIG. 6 is a schematic illustration by taking the shapes of the orthographic projections of the plurality of through holes V in the insulating protective layer 402 onto the substrate 100 as circles. In other possible implementations, the shapes of the orthographic projections of the plurality of through holes V in the insulating protective layer 402 onto the substrate 100 may also all be polygonal, rectangular or other shapes, which are not limited in the embodiments of the present disclosure.

In the case that the shape of the orthographic projection of the through hole V in the insulating protective layer 402 onto the substrate 100 is a circle, the through holes V in the insulating protective layer 402 have the same diameter, and a distance h between any two adjacent through holes V of the insulating protective layer 402 is greater than or equal to the diameter r of the through hole V. In this way, although the plurality of through holes V are provided in the protective cover 400, the strength of the protective cover 400 is relatively high, so as to ensure that the protective cover 400 is not easily broken.

In some embodiments of the present disclosure, since the conductive structure 401 is disposed in the corresponding through hole V in the protective cover 400 and the conductive structure 401 is usually made of a metal material, in order to ensure high strength of the protective cover 400, the thickness of the insulating protective layer 402 in the protective cover 400 ranges from 0.1 mm to 0.5 mm. In some embodiments, the thickness of the insulating protective layer 402 in the protective cover 400 is 0.25 mm.

It should be noted that the insulating protective layer 402 in the protective cover 400 is a sheet-like structure made of at least one of glass material, ceramic material and polycarbonate. In other possible implementations, the insulating protective layer 402 is made of other thinner materials, which is not limited in the embodiments of the present disclosure. The conductive structure 401 is made of at least one conductive material such as copper, silver, aluminum, iron, and the like. In some embodiments, in the case that the insulating protective layer 402 in the protective cover 400 is made of a glass material, the plurality of through holes V are etched in the insulating protective layer 402 by a laser etching process, and then the conductive structure 401 is deposited in the through hole V in the insulating protective layer 402 by an electroplating process, and finally the conductive structure 401 higher than the insulating protective layer 402 in the protective cover 400 is etched away by an etching process, such that the height of the conductive structure 401 in the protective cover 400 is the same as the thickness of the insulating protective layer 402.

Figure 7:
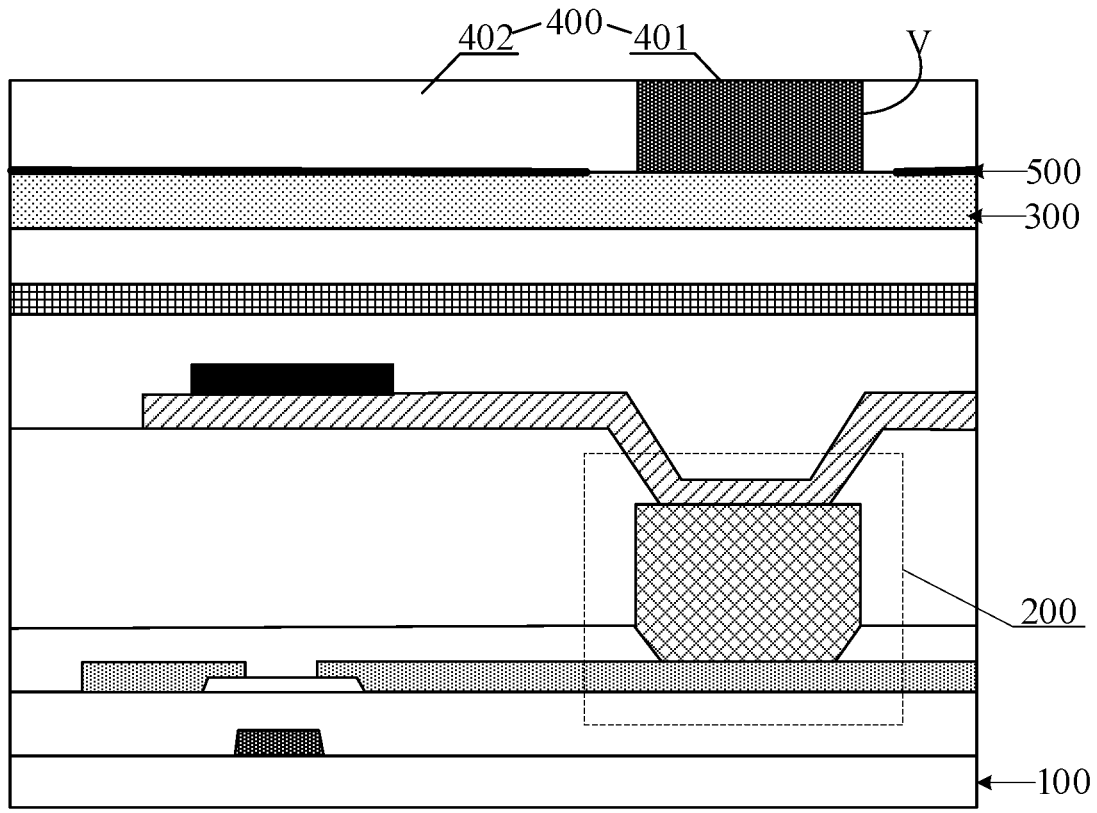
FIG. 7 is a schematic structural diagram of yet another fingerprint sensor according to some embodiments of the present disclosure.

In some embodiments of the present disclosure, referring to FIG. 7, FIG. 7 is a schematic structural diagram of another fingerprint sensor according to some embodiments of the present disclosure. The fingerprint sensor 000 further includes an adhesive layer 500 disposed between the protective cover 400 and the light-emitting module 300. An orthographic projection of the adhesive layer 500 onto the substrate 100 is not in coincidence with the orthographic projection of the conductive structure 401 onto the substrate 100. In this way, the protective cover 400 is bonded to the side, distal to the substrate 100, of the light-emitting module 300 through the adhesive layer 500, and the adhesive layer 500 does not exist between the conductive structure 401 in the protective cover 400 and the light-emitting module 300, such that the conductive structure 401 is electrically connected to the light-emitting module 300 normally.

It should be noted that since the thickness of the adhesive layer 500 generally ranges from 10 microns to 25 microns, which is much smaller than the thickness of the protective cover 400, the adhesive layer 500 does not affect the electrical connection between the conductive structure 401 and the light-emitting module 300. That is, even if the adhesive layer 500 is provided between the protective cover 400 and the light-emitting module 300, the conductive structure 401 in the protective cover 400 is in normal contact with the light-emitting module 300. Moreover, after the adhesive layer 500 is provided between the protective cover 400 and the light-emitting module 300, it is necessary to use a high-pressure degassing machine to vacuumize the fingerprint sensor 000 to make the air in the space where the adhesive layer 500 is not distributed between the protective cover 400 and the light-emitting module 300 is exhausted, such that the conductive structure 401 in the protective cover 400 is in contact with the light-emitting module 300, thereby making the electrical connection between the conductive structure 401 and the light-emitting module 300 better. In some embodiments, after the adhesive layer 500 is provided between the protective cover 400 and the light-emitting module 300, the fingerprint sensor 000 is placed in the high-pressure degassing machine, and then the pressure in the high-pressure degassing machine is reduced to a negative pressure, such that the air in the space where the adhesive layer 500 is not distributed between the protective cover 400 and the light-emitting module 300 is drawn out to ensure that the conductive structure 401 in the protective cover 400 can be in contact with the light-emitting module 300.

It should also be noted that, here, the adhesive layer 500 is thermosetting adhesive or light curing adhesive. The thermosetting adhesive refers to glue that forms a bonding effect by heating and curing. For example, the thermosetting adhesive is an improved epoxy adhesive. The light curing adhesive refers to glue that can be cured by light to form a bonding effect. For example, the light curing adhesive is UV glue that is cured under ultraviolet radiation. In the embodiment of the present disclosure, any kind of glue is used to achieve the purpose of bonding the protective cover 400 and the light-emitting module 300.

Figure 8:
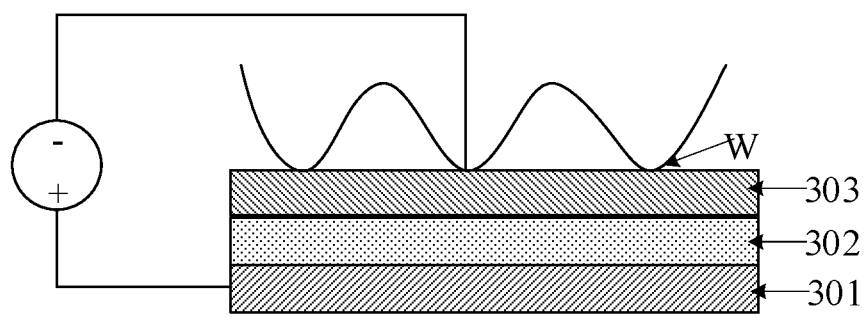
FIG. 8 is a schematic diagram of light emission of a light-emitting module according to some embodiments of the present disclosure.

In some embodiments of the present disclosure, referring to FIG. 8, FIG. 8 is a schematic diagram of light emission of a light-emitting module according to some embodiments of the present disclosure. The light-emitting module 300 in the fingerprint sensor 000 includes a first light-transmitting electrode 301, a light-emitting layer 302 and a dielectric layer 303 laminated in a direction perpendicular to and away from the substrate 100. The dielectric layer 303 is electrically connected to the conductive structure 401. Here, the first light-transmitting electrode 301, the light-emitting layer 302 and the dielectric layer 303 may all be film structures that are provided as a whole layer.

In the present disclosure, here, an AC drive unit is used to apply a certain amount of AC power to the first light-transmitting electrode 301 in the light-emitting module 300, and a human body needs to be in contact with a ground terminal of the AC drive unit. In some embodiments, the AC drive unit applies an AC voltage ranging from 30 volts to 110 volts to the first light-transmitting electrode 301 in the light-emitting module 300 to keep the light-emitting module 300 in an on state. In this way, after a user's finger presses the fingerprint sensor 000, a fingerprint ridge W in the finger conducts with the dielectric layer 303 in the light-emitting module 300, and a loop is formed between the user's finger, the first light-transmitting electrode 301 and the dielectric layer 033, such that an electric field can be formed between the fingerprint ridge W conducting with the dielectric layer 303 and the first light-transmitting electrode 301, and under the action of the electric field force, the part of the light-emitting layer 302 corresponding to the fingerprint ridge W emits light.

In some embodiments of the present disclosure, the dielectric layer 303 in the light-emitting module 300 is realized in many ways, and the embodiments of the present disclosure only take the following two cases as examples for schematic illustration.

In a first case, the dielectric layer 303 in the light-emitting module 300 is a light-shielding dielectric layer. Here, the light-shielding dielectric layer prevents ambient light from entering the light-emitting layer 303 and causing interference to the light-emitting module 300.

Figure 9:
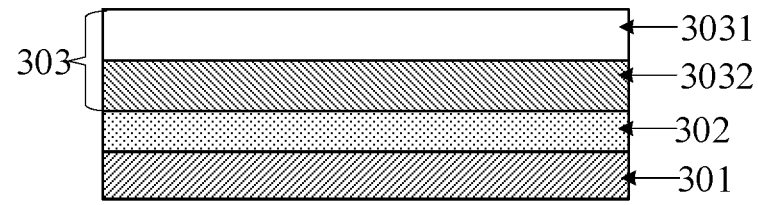
FIG. 9 is a schematic diagram of a film layer structure of a light-emitting module according to some embodiments of the present disclosure.

In a second case, referring to FIG. 9, FIG. 9 is a schematic diagram of a film layer structure of a light-emitting module according to some embodiments of the present disclosure. The dielectric layer 303 in the light-emitting module 300 includes a protective dielectric layer 3031 and a light-shielding dielectric layer 3032 that are laminated. The protective dielectric layer 3031 is closer to the protective cover 400 than the light-shielding dielectric layer 3032 being.

In the above two cases, a carbon black structure needs to be provided in the light-shielding dielectric layer 3032 such that it has a certain light-shielding ability. For the second case above, the protective dielectric layer 3031 and the light-shielding dielectric layer 3032 have the same dielectric constant. Since the carbon black structure in the light-shielding dielectric layer 3032 has a certain conductivity, in order to ensure that the user uses the fingerprint sensor safely, it is necessary to add the protective dielectric layer 3031 with better insulation between the protective cover 400 and the light-shielding dielectric layer 3032.

It should be noted that the light-emitting layer 302 in the light-emitting module 300 includes a combined structure of organic glass, 8-hydroxyquinoline, aluminum and coumarin 545T, a combined structure of organic glass, 8-hydroxyquinoline, aluminum and red light doped material-organic fluorescent doped material, a combined structure of epoxy resin, zinc sulfide and rubrene, a combined structure of polyvinylcarbazole, cadmium selenide and copper oxide, and a combined structure of epoxy resin and copper calcium titanate structure. The dielectric layer 303 in the light-emitting module 300 is a layered layer prepared from solid insulating glue and at least one of barium titanate, zirconium dioxide, tantalum pentoxide and carbon black in the fixing glue.

Figure 10:
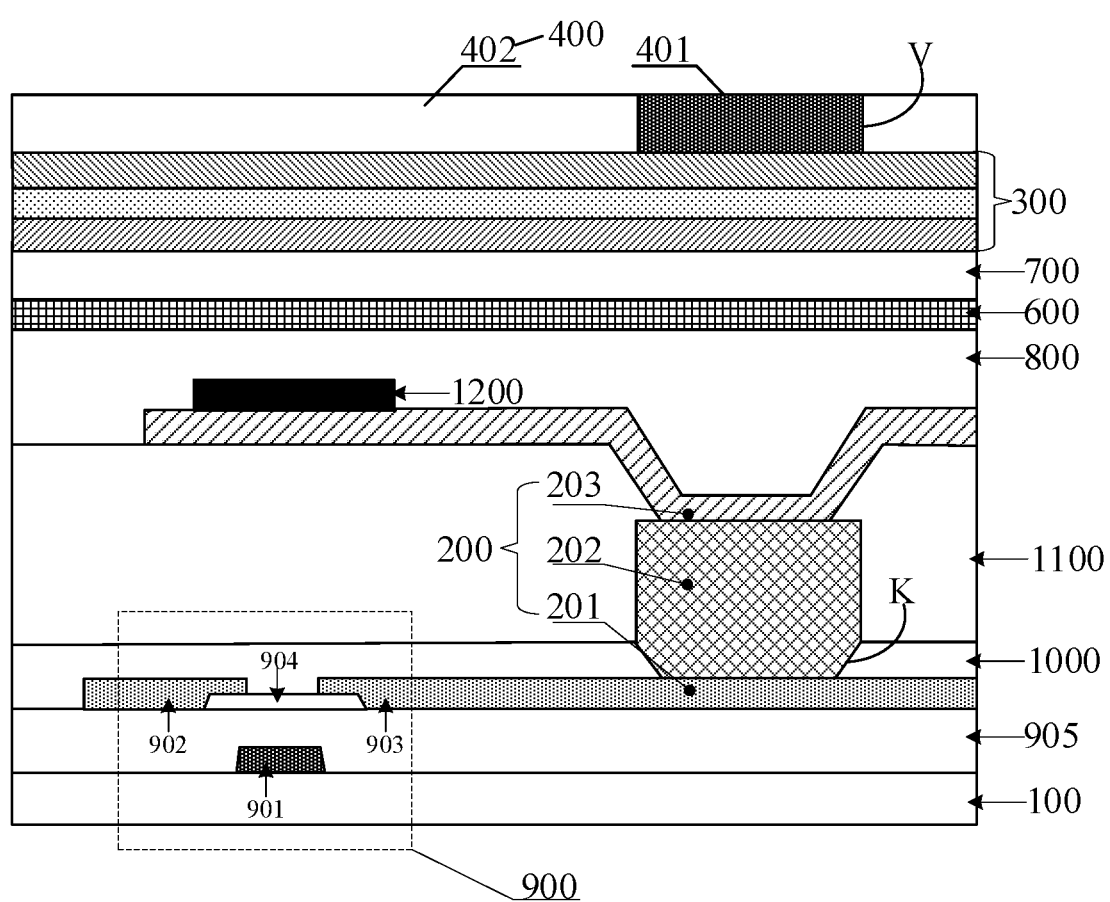
FIG. 10 is a schematic diagram of a film layer structure of a fingerprint sensor according to some embodiments of the present disclosure.

In some embodiments of the present disclosure, referring to FIG. 10, FIG. 10 is a schematic diagram of a film layer structure of a fingerprint sensor according to some embodiments of the present disclosure. The photosensitive device 200 in the fingerprint sensor 000 includes a first light-shielding electrode 201, a photoelectric conversion layer 202 and a second light-transmitting electrode 203 laminated in a direction perpendicular to and away from the substrate 100. Here, the photoelectric conversion layer 202 is a PIN structure formed by laminating a P-type semiconductor layer, an intrinsic semiconductor layer and an N-type semiconductor layer. The second light-transmitting electrode 203 is electrically connected to a control component through a bias signal line, such that the control component applies a bias voltage onto the second light-transmitting electrode 203 through the bias signal line, and the photosensitive device 200 is in a working state. In this way, when the photoelectric conversion layer 202 senses target light, the photoelectric conversion layer 202 may respond to the received target light, and then generate and store a photocurrent signal, and export the photocurrent signal from the first light-shielding electrode 201 in the form of an electrical signal. Here, the target light is the light emitted from the light-emitting module 300.

In the present disclosure, the fingerprint sensor 000 further includes a light-transmitting shielding electrode 600 disposed between the first light-transmitting electrode 301 and the second light-transmitting electrode 203. The light-transmitting shielding electrode 600 is insulated from the first light-transmitting electrode 301 and the second light-transmitting electrode 203.

In some embodiments of the present disclosure, the fingerprint sensor 000 further includes a transparent substrate 700 disposed on a side, proximal to the substrate 100, of the first light-transmitting electrode 301 and a transparent insulating layer 800 disposed on a side, distal to the substrate 100, of the second light-transmitting electrode 203. Here, the transparent substrate 700 is a layered structure made of transparent insulating materials such as glass, polyethylene terephthalate, polyethylene naphthalate, and polyimide. In this way, the light-transmitting shielding electrode 600 is insulated from the first light-transmitting electrode 301 through the transparent substrate 700, and is insulated from the second light-transmitting electrode 203 through the transparent insulating layer 800. In this way, the light-transmitting shielding electrode 600 prevents interference between the AC signal applied to the first light-transmitting electrode 301 and the bias voltage applied to the second light-transmitting electrode 203, ensuring that the light-emitting module 300 and the photosensitive device 200 can both work normally. Moreover, the light-transmitting shielding electrode 600 also prevents static electricity generated in the fingerprint sensor 000 from affecting the light-emitting module 300 and the photosensitive device 200.

In this case, after the conductive structure 401 is in contact with the fingerprint ridge in the user's finger, the part of the light-emitting module 300 corresponding to the conductive structure 401 emits light, and the light is directed to the photoelectric conversion layer 202 after passing through the first light-transmitting electrode 301, the light-transmitting shielding electrode 600 and the second light-transmitting electrode 203 in sequence, such that the photoelectric conversion layer 202 generates and stores a photocurrent signal in response to the received light, and export the photocurrent signal from the first light-shielding electrode 201 in the form of an electrical signal.

It should be noted that the first light-transmitting electrode 301, the light-transmitting shielding electrode 600 and the second light-transmitting electrode 203 may all be indium tin oxide (ITO), indium-doped zinc oxide (IZO), Poly(3,4-ethylenedioxythiophene) (PEDOT) or silver nanowires and other transparent conductive materials.

In some embodiments of the present disclosure, as shown in FIG. 10, the fingerprint sensor 000 further includes a drive circuit disposed on the substrate 100 and electrically connected to the first light-shielding electrode 201 in the photosensitive device 200. Here, the drive circuit is provided with at least one thin-film transistor 900. The thin-film transistor 900 includes a gate 901, a first electrode 902, a second electrode 903 and an active layer 904. Both the first electrode 902 and the second electrode 903 are coupled with the active layer 904. The active layer 904 is insulated from the gate 901. For example, the active layer 904 and the gate 901 is insulated from each other by the gate insulating layer 905. It should be noted that the first electrode 902 of the thin-film transistor 900 is one of the source and the drain, and the second electrode 903 is the other of the source and the drain.

In this case, the first electrode 902 is electrically connected to the control component through a signal line, and the first light-shielding electrode 201 is electrically connected to the second electrode 903 in the thin-film transistor. In this way, when the photosensitive device 200 senses target light, the photosensitive device 200 generates and stores a photocurrent signal. If the photocurrent signal needs to be exported from the first light-shielding electrode 201 and transmitted to the control component, it is necessary to apply a bias voltage on the gate 901 in the thin-film transistor to turn on the thin-film transistor, such that the photocurrent signal on the first light-shielding electrode 201 is transmitted from the first electrode 902 to the control component through the signal line in the form of an electrical signal.

It should be noted that the fingerprint sensor 000 further includes a first planarization layer 1000 and a second planarization layer 1100. The first planarization layer 1000 is provided with a plurality of openings K. In each opening K, the part of the photoelectric conversion layer 202 disposed in the opening K is electrically connected to the first light-shielding electrode 201. The second planarization layer 1100 is disposed between the first planarization layer 1000 and the second light-transmitting electrode 203. The first light-shielding electrode 201 and the second electrode 903 in the thin-film transistor are disposed in the same layer and made of the same material.

In some embodiments of the present disclosure, the photosensitive device 200 further includes a second light-shielding electrode 1200 disposed on a side, distal to the substrate 100, of the second light-transmitting electrode 203. An orthographic projection of the second light-shielding electrode 1200 onto the substrate 100 is not in coincidence with an orthographic projection of the photoelectric conversion layer 202 onto the substrate 100. An orthographic projection of the active layer 904 in the thin-film transistor 900 onto the substrate 100 falls within the orthographic projection of the second light-shielding electrode 1200 onto the substrate 100. In this way, the second light-shielding electrode 1200 can shield the active layer 904, so as to prevent voltage threshold shift of the active layer 904 under the irradiation of light.

It should be noted that the second light-shielding electrode 1200, the first light-shielding electrode 201, and the first electrode 902, the second electrode 903 and the gate 901 in the thin-film transistor 900 may all be electrodes made of metal materials.

In summary, the fingerprint sensor according to the embodiments of the present invention includes a substrate, a photosensitive device, a light-emitting module and a protective cover. Since the protective cover is provided with a plurality of conductive structures electrically connected to the light-emitting module and an orthographic projection of each conductive structure onto the substrate is at least partially overlapped with an orthographic projection of the photosensitive device corresponding to the conductive structure onto the substrate, on the premise that the light-emitting module is protected by the protective cover, it is ensured that a fingerprint ridge in a user's finger is electrically connected to the light-emitting module through the conductive structure, such that the fingerprint sensor normally detects the fingerprint of the user's finger. In this way, the probability that a side, distal to the substrate, of the light-emitting module is scratched is effectively reduced, thereby making the sensing effect of the fingerprint sensor better.

Figure 11:
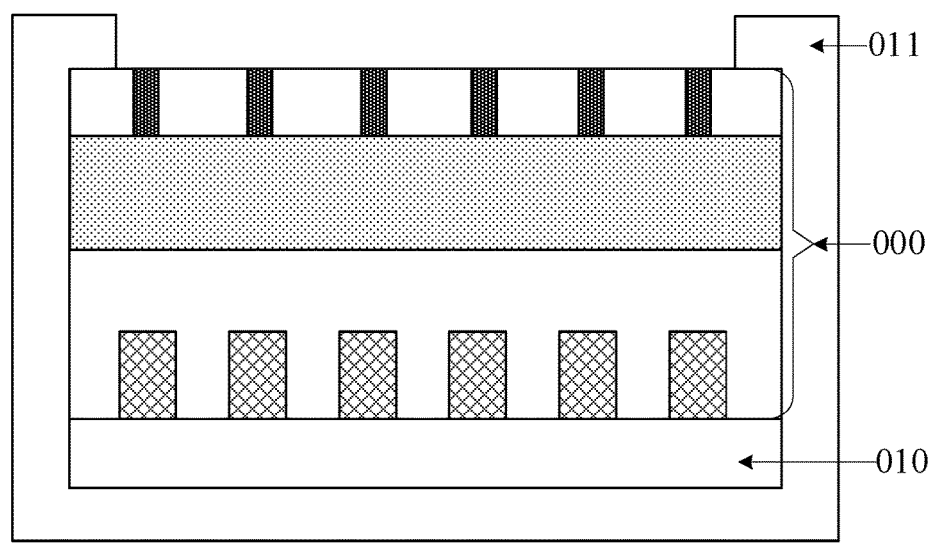
FIG. 11 is a schematic structural diagram of an electronic device according to some embodiments of the present disclosure.

Some embodiments of the present disclosure also provide an electronic device. Referring to FIG. 11, FIG. 11 is a schematic structural diagram of an electronic device according to some embodiments of the present disclosure. The electronic device 111 includes a control component 010, and any one of the aforementioned fingerprint sensors 000 electrically connected to the control component 010. Here, the control component 010 controls the AC power in the fingerprint sensor 000 electrically connected to the light-emitting module 300, and also controls the drive circuit in the fingerprint sensor 000 electrically connected to the photosensitive device 200.

Figure 12:
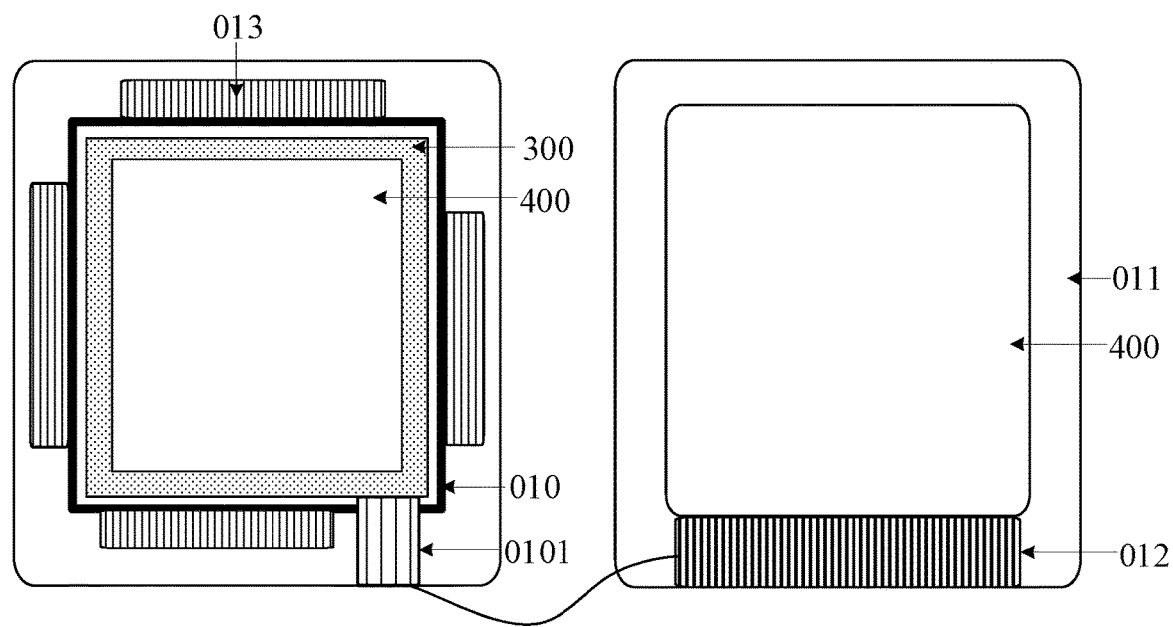
FIG. 12 is a top view of an electronic device according to some embodiments of the present disclosure.

In some embodiments of the present disclosure, referring to FIG. 12, FIG. 12 is a top view of an electronic device according to some embodiments of the present disclosure. The electronic device 111 further includes an encapsulation housing 011 connected to an edge area of the fingerprint sensor 000 and a metal sheet 012 disposed on the encapsulation housing 011. Here, the metal sheet 012 is on the same surface as the front surface of the fingerprint sensor 000.

In the present disclosure, the control component 010 is provided with an AC drive unit 0101. A power line of the AC drive unit 0101 is electrically connected to the first light-transmitting electrode 301 in the light-emitting module 300, and a ground line of the AC drive unit 0101 is electrically connected to the metal sheet 012. In this way, when a user uses the electronic device 111 to collect a fingerprint, a part of the user's body (e.g., the palm) contacts with the metal sheet 012, and the user's finger touches the protective cover 400 such that the part of the light-emitting module 300 that is in contact with the fingerprint ridge emits light. During this process, the dielectric layer 303 in the light-emitting module 300 can ensure that the current in the user's finger is within a safe range (e.g., the current in the user's finger is less than or equal to 10 mA (milliampere)). In some embodiments, in the case that the voltage of the AC drive unit 0101 ranges from 30V (volts) to 110V (volts) and the frequency of the AC voltage ranges from 5 Hz (hertz) to 30 KHz (kilohertz), the dielectric constant of the dielectric layer 303 ranges from 2000 (farm/meter) to 3000 (farm/meter), which makes the current in the user's finger within a safe range.

In some embodiments of the present disclosure, the electronic device 111 further includes an anti-static damage module 013 electrically connected to the AC drive unit 0101.

The anti-static damage module 013 is distributed around the light-emitting module 300 to prevent static electricity from breaking down the light-emitting module 300, such that the service life of the electronic device 111 is longer.

It should be noted that in the drawings, the dimensions of layers and regions may be exaggerated for clarity of illustration. Also it will be understood that when an element or layer is referred to as being "on" another element or layer, it can be directly on the other element or intervening layers may be present. Further, it will be understood that when an element or layer is referred to as being "under" another element or layer, it can be directly under the other element, or one or more intervening layers or elements may be present. In addition, it will also be understood that when a layer or element is referred to as being "between" two layers or elements, it can be the only layer between the two layers or elements, or one or more intervening layers or elements may also be present. Like reference numerals designate like elements throughout.

In the present disclosure, the terms "first" and "second" are used for descriptive purposes only, and should not be construed as indicating or implying relative importance. The term "plural" means two or more, unless otherwise clearly defined.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

The invention claimed is:
1. A fingerprint sensor, comprising:
a substrate;
a plurality of photosensitive devices disposed on the substrate;
a light-emitting module disposed on a side, distal to the substrate, of the plurality of photosensitive devices; and
a protective cover disposed on a side, distal to the substrate, of the light-emitting module, wherein the protective cover is provided with a plurality of conductive structures electrically connected to the light-emitting module, the plurality of conductive structures being in one-to-one correspondence with the plurality of photosensitive devices, and an orthographic projection of each conductive structure onto the substrate at least partially being overlapped with an orthographic projection of the photosensitive device corresponding to the conductive structure onto the substrate,
wherein the orthographic projection of each conductive structure onto the substrate falls within the orthographic projection of the photosensitive device corresponding to the conductive structure onto the substrate, an area of the orthographic projection of each conductive structure onto the substrate is less than or equal to an area of the orthographic projection of the photosensitive device corresponding to the conductive structure onto the substrate,
wherein a width of the orthographic projection of each conductive structure onto the substrate in a target direction is equal to a width of the orthographic projection of the photosensitive device corresponding to the conductive structure onto the substrate in the target direction; or
the width of the orthographic projection of each conductive structure onto the substrate in the target direction is equal to half of the width of the photosensitive device corresponding to the conductive structure onto the substrate in the target direction;

wherein the target direction is a row arrangement direction or a column arrangement direction of the plurality of photosensitive devices.

2. The fingerprint sensor according to claim 1, wherein the protective cover comprises an insulating protective layer and the plurality of conductive structures, the insulating protective layer being provided with a plurality of through holes in one-to-one correspondence with the plurality of conductive structures, and each conductive structure being disposed in the through hole corresponding to the conductive structure.

3. The fingerprint sensor according to claim 2, wherein each conductive structure is a columnar structure distributed in the through hole corresponding to the conductive structure, and a thickness of the insulating protective layer is the same as a height of the conductive structure.

4. The fingerprint sensor according to claim 2, wherein an orthographic projection of the through hole onto the substrate is circular, and a distance between any two adjacent through holes in the insulating protective layer is greater than or equal to a diameter of the through hole.

5. The fingerprint sensor according to claim 2, wherein the insulating protective layer is a sheet-like structure comprising glass material, ceramic material, polycarbonate, or any combination thereof.

6. The fingerprint sensor according to claim 2, wherein the thickness of the insulating protective layer ranges from 0.1 mm to 0.5 mm.

7. The fingerprint sensor according to claim 1, wherein the conductive structure is a columnar structure comprising copper, silver, aluminum iron, or any combination thereof.

8. The fingerprint sensor according to claim 1, further comprising: an adhesive layer disposed between the protective cover and the light-emitting module, an orthographic projection of the adhesive layer onto the substrate being not in coincidence with orthographic projections of the conductive structures onto the substrate.

9. The fingerprint sensor according to claim 1, wherein the light-emitting module comprises a first light-transmitting electrode, a light-emitting layer and a dielectric layer laminated in a direction perpendicular to and away from the substrate, the dielectric layer being electrically connected to the conductive structure;

the photosensitive device comprises a first light-shielding electrode, a photoelectric conversion layer and a second light-transmitting electrode laminated in the direction perpendicular to and away from the substrate; and the fingerprint sensor further comprises a light-transmitting shielding electrode disposed between the first light-transmitting electrode and the second light-transmitting electrode, the light-transmitting shielding electrode being insulated from the first light-transmitting electrode and the second light-transmitting electrode.

10. The fingerprint sensor according to claim 9, wherein the dielectric layer is a light-shielding dielectric layer.

11. The fingerprint sensor according to claim 9, wherein the dielectric layer comprises a protective dielectric layer and a light-shielding dielectric layer that are laminated, the protective dielectric layer being closer to the protective cover than the light-shielding dielectric layer being.

12. The fingerprint sensor according to claim 9, further comprising: a drive circuit disposed on the substrate and electrically connected to the first light-shielding electrode in the photosensitive device.

13. The fingerprint sensor according to claim 12, wherein the drive circuit is provided with at least one thin-film transistor, and the photosensitive device further comprises a second light-shielding electrode disposed on a side, distal to the substrate, of the second light-transmitting electrode, an orthographic projection of the second light-shielding electrode onto the substrate being not in coincidence with an orthographic projection of the photoelectric conversion layer onto the substrate, and an orthographic projection of an active layer in the thin-film transistor onto the substrate falling within the orthographic projection of the second light-shielding electrode onto the substrate.

14. An electronic device, comprising: a control component, and a fingerprint sensor electrically connected to the control component; wherein the fingerprint sensor comprises:

a substrate;

a plurality of photosensitive devices disposed on the substrate;

a light-emitting module disposed on a side, distal to the substrate, of the plurality of photosensitive devices; and a protective cover disposed on a side, distal to the substrate, of the light-emitting module, wherein the protective cover is provided with a plurality of conductive structures electrically connected to the light-emitting module, the plurality of conductive structures being in one-to-one correspondence with the plurality of photosensitive devices, and an orthographic projection of each conductive structure onto the substrate at least partially being overlapped with an orthographic projection of the photosensitive device corresponding to the conductive structure onto the substrate, wherein the orthographic projection of each conductive structure onto the substrate falls within the orthographic projection of the photosensitive device corresponding to the conductive structure onto the substrate, an area of the orthographic projection of each conductive structure onto the substrate is less than or equal to an area of the orthographic projection of the photosensitive device corresponding to the conductive structure onto the substrate, wherein a width of the orthographic projection of each conductive structure onto the substrate in a target direction is equal to a width of the orthographic projection of the photosensitive device corresponding to the conductive structure onto the substrate in the target direction; or the width of the orthographic projection of each conductive structure onto the substrate in the target direction is equal to half of the width of the photosensitive device corresponding to the conductive structure onto the substrate in the target direction;

wherein the target direction is a row arrangement direction or a column arrangement direction of the plurality of photosensitive devices.

15. The electronic device according to claim 14, further comprising: an encapsulation housing connected to an edge area of the fingerprint sensor, and a metal sheet disposed on the encapsulation housing, and wherein the control component is provided with an AC drive unit, a power line of the AC drive unit being electrically connected to a first light-transmitting electrode in the light-emitting module, and a ground line of the AC drive unit being electrically connected to the metal sheet.

16. The electronic device according to claim 14, wherein the protective cover comprises an insulating protective layer and the plurality of conductive structures, the insulating protective layer being provided with a plurality of through holes in one-to-one correspondence with the plurality of conductive structures, and each conductive structure being disposed in the through hole corresponding to the conductive structure.

\* \* \* \* \*